(12) United States Patent
Shi

(10) Patent No.: US 11,430,706 B2
(45) Date of Patent: Aug. 30, 2022

(54) PACKAGING STRUCTURE

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 35 days.

(21) Appl. No.: 16/235,389

(22) Filed: Dec. 28, 2018

(65) Prior Publication Data

US 2019/0385921 A1 Dec. 19, 2019

(30) Foreign Application Priority Data

Jun. 14, 2018 (CN) .......................... 201810614302.6

(51) Int. Cl.
| | |
|---|---|
| *H01L 23/02* | (2006.01) |
| *H01L 23/48* | (2006.01) |
| *H01L 23/52* | (2006.01) |
| *H01L 23/31* | (2006.01) |
| *H01L 23/00* | (2006.01) |
| *H01L 21/56* | (2006.01) |
| *H01L 23/498* | (2006.01) |

(52) U.S. Cl.
CPC .......... *H01L 23/3114* (2013.01); *H01L 21/56* (2013.01); *H01L 23/3128* (2013.01); *H01L 23/481* (2013.01); *H01L 23/49816* (2013.01); *H01L 24/17* (2013.01); *H01L 24/33* (2013.01); *H01L 24/73* (2013.01)

(58) Field of Classification Search
CPC ... H01L 21/56; H01L 23/3128; H01L 23/481; H01L 23/49816; H01L 24/17; H01L 24/33; H01L 24/73; H01L 23/488; H01L 23/49838; H01L 21/4885; H01L 2225/06513; H01L 2225/06517; H01L 2224/0401; H01L 2224/1112; H01L 2224/11502; H01L 2224/11526; H01L 2224/13006; H01L 2224/13007
USPC .......................... 257/678, 778–780, 782, 786
See application file for complete search history.

(56) References Cited

U.S. PATENT DOCUMENTS

| | | | |
|---|---|---|---|
| 9,934,989 B1* | 4/2018 | Williamson | H01L 21/4832 |
| 2014/0252598 A1* | 9/2014 | Yu | H01L 24/14 257/737 |
| 2015/0340332 A1* | 11/2015 | Rinne | H01L 23/49811 257/737 |
| 2016/0300808 A1* | 10/2016 | Kuo | H01L 24/11 |

(Continued)

*Primary Examiner* — Caleb E Henry
*Assistant Examiner* — Dilinh P Nguyen
(74) *Attorney, Agent, or Firm* — Anova Law Group, PLLC

(57) ABSTRACT

A packaging structure includes a semiconductor chip and conductive connection pillars. Each of the conductive connection pillars has a first surface and a second surface opposite to the first surface, and the first surfaces of the conductive connection pillars are fixed to a surface of the semiconductor chip. The packaging structure also includes a carrier plate. The carrier plate is disposed opposite to the semiconductor chip. The conductive connection pillars are located between the semiconductor chip and the carrier plate, and the second surfaces face the carrier plate. The packaging structure further includes solder layers located between the carrier plate and the second surfaces, and a barrier layer located on the surface of the carrier plate around the solder layers.

15 Claims, 8 Drawing Sheets

(56) References Cited

U.S. PATENT DOCUMENTS

2017/0317036 A1* 11/2017 Myers ................ H01L 23/3114
2018/0130749 A1* 5/2018 Tsai .................... H01L 21/6835
2019/0096866 A1* 3/2019 Hsu ................... H01L 21/76846

* cited by examiner

PACKAGING STRUCTURE

CROSS-REFERENCES TO RELATED APPLICATIONS

This application claims priority of Chinese Patent Application No. 201810614302.6, filed on Jun. 14, 2018, the entire contents of which are hereby incorporated by reference.

FIELD OF THE INVENTION

The present disclosure generally relates to the field of packaging and, more particularly, relates to a packaging structure.

BACKGROUND

A flip-chip method may be used for chip-interconnection and chip-bonding. International Business Machines Corporation (IBM) developed and used a flip-chip technology more than 50 years ago. However, it is until recently that the flip-chip method became used in packaging high-end devices and in high-density packaging. Currently, the flip-chip packaging technology has been more widely used, with diversified packaging forms and increased demands.

However, performances of a packaging structure formed by an existing flip-chip method are undesirable. The disclosed methods and structures are directed to solve one or more problems set forth above and other problems in the art.

BRIEF SUMMARY OF THE DISCLOSURE

One aspect of the present disclosure includes a packaging structure. The packaging structure includes a semiconductor chip and conductive connection pillars. Each of the conductive connection pillars has a first surface and a second surface opposite to the first surface, and the first surfaces of the conductive connection pillars are fixed to a surface of the semiconductor chip. The packaging structure also includes a carrier plate. The carrier plate is disposed opposite to the semiconductor chip. The conductive connection pillars are located between the semiconductor chip and the carrier plate, and the second surfaces face the carrier plate. The packaging structure further includes solder layers located between the carrier plate and the second surfaces, and a barrier layer located on the surface of the carrier plate around the solder layers.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

Performances of a packaging structure formed by an existing flip-chip method are undesirable.

Figure 1:
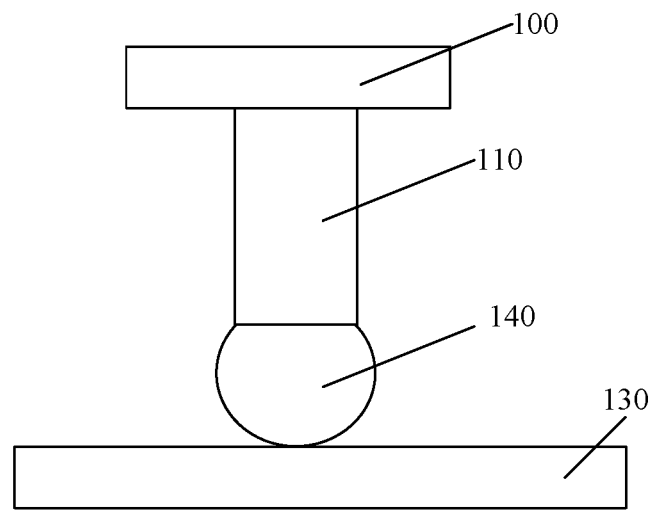
FIGS. 1 to 2 illustrate structures corresponding to certain stages of a flip-chip method.
Figure 2:
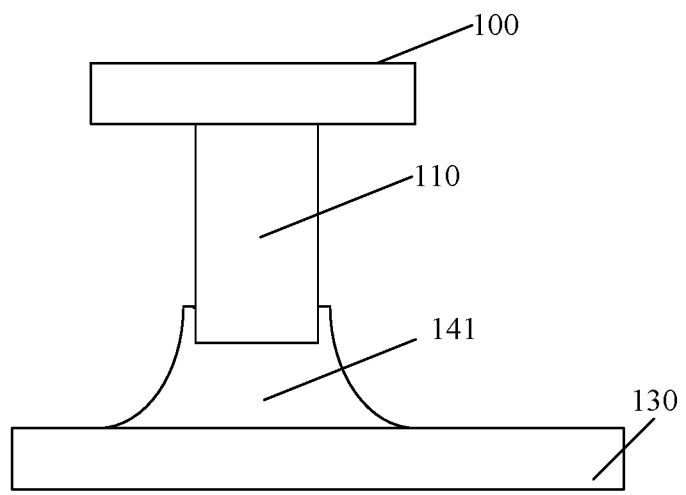

FIGS. 1 to 2 illustrate structures corresponding to certain stages of an existing flip-chip method. Referring to FIG. 1, a semiconductor chip 100, a conductive connection pillar 110, and a carrier plate 130 are provided. The conductive connection pillar 110 has a first surface and a second surface opposite to the first surface. The conductive connection pillar 110 is fixed on a surface of the semiconductor chip 100, and the first surface faces the semiconductor chip 100. A solder ball 140 is fixedly disposed on the second surface of the conductive connection pillar 110. After that, the semiconductor chip 100, the conductive connection pillar 110 and the solder ball 140 are placed above a surface of a carrier plate 130, and the soldered ball 140 is in contact with the surface of the carrier plate 130.

Referring to FIG. 2, after the semiconductor chip 100, the conductive connection pillar 110, and the solder ball 140 are placed above the surface of the carrier plate 130, a reflow-soldering process is performed, thereby forming a solder layer 141 from the solder ball 140.

During the reflow-soldering process, the material of the solder ball 140 melts into liquid. Under the action of gravity, the material of the solder ball 140 may flow horizontally along the surface of the carrier plate 130, causing the solder layer 141 to collapse. As a result, the bottom of the solder layer 141 may have a large radial dimension, and thus adjacent solder layers 141 may be shorted.

The present disclosure provides a packaging structure. The packaging structure includes a semiconductor chip and conductive connection pillars. Each of the conductive connection pillars has a first surface and a second surface that are opposite to each other, and the first surface of the conductive connection pillar is fixed to a surface of the semiconductor chip. The packaging structure also includes a carrier plate, and the carrier plate is disposed opposite to the semiconductor chip. The conductive connection pillars are located between the semiconductor chip and the carrier plate, and the second surfaces face the carrier plate. The packaging structure also includes solder layers located between the carrier plate and the second surfaces, and a second barrier layer located on the surface of the carrier plate around the solder layers. The packaging structure may have an improved performance.

Figure 3:
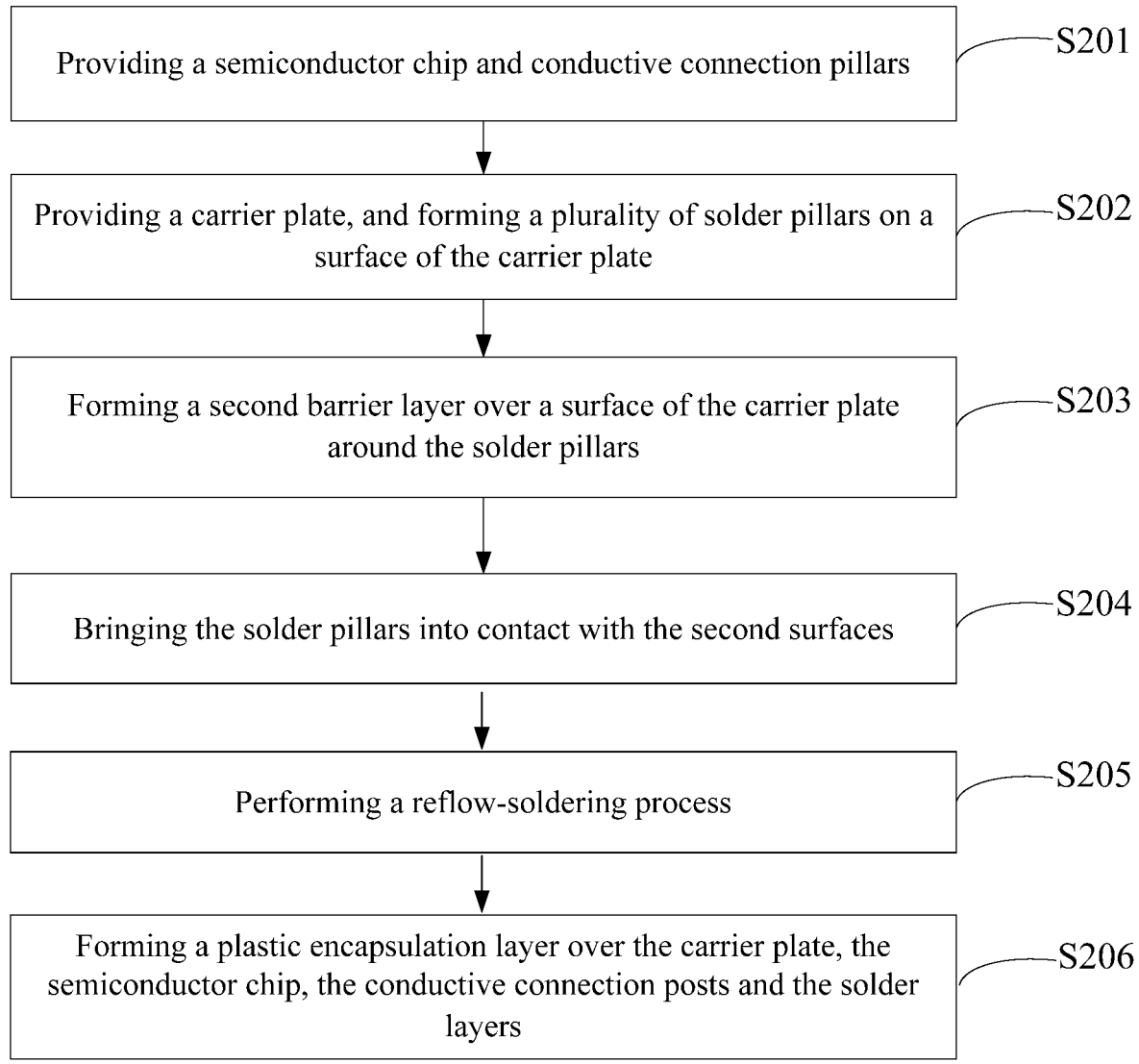
FIG. 3 illustrates an exemplary process of forming a packaging structure consistent with the disclosed embodiments.

FIG. 3 illustrates an exemplary process of forming a packaging structure. FIGS. 4 to 12 illustrate structures corresponding to certain stages of an exemplary process of forming a packaging structure.

Figure 4:
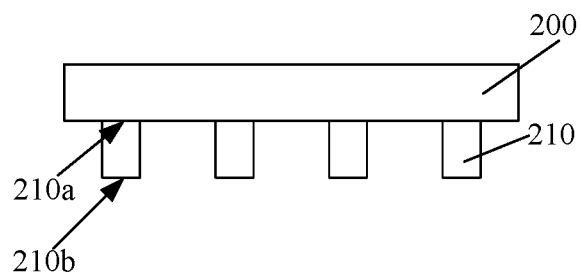
FIGS. 4 to 12 illustrate structures corresponding to certain stages of an exemplary process of forming a packaging structure consistent with the disclosed embodiments.

As shown in FIG. 3, at the beginning of the process of forming a packaging structure, a semiconductor chip 200 and conductive connection pillars 210 are provided (S201). Referring to FIG. 4, each of the conductive connection pillars 210 has a first surface 210a and a second surface 210b opposite to the first surface 210a. The conductive connection pillars 210 are fixed on a surface of the semiconductor chip 200, and the first surfaces 210a face the semiconductor chip 200.

In one embodiment, there is a plurality of the conductive connection pillars 210; while in some other embodiments, there may be only one conductive connection pillar.

In one embodiment, the first surfaces 210a and the second surfaces 210b are parallel to the surface of the semiconductor chip 200, and sidewalls of the conductive connection pillars 210 are perpendicular to the surface of the semiconductor chip 200.

The material of the conductive connecting pillars 210 may be a metal, for example, copper. The conductive connection pillars 210 may electrically connect the semiconductor chip 200 and a carrier plate 300.

Figure 5:
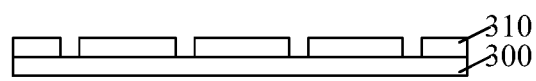
Figure 6:
Figure 7:

Returning to FIG. 3, a carrier plate 300 is provided, and a plurality of solder pillars 320 are formed on a surface of the carrier plate 300 (S202). FIGS. 5-7 illustrate corresponding structures. The number of the solder pillars 320 is equal to the number of the conductive connection pillars 210. In some other embodiments, there may be only one conductive connection pillar, and there may be only one solder pillar.

After the solder pillars 320 are subsequently brought into contact with the second surfaces 210b, each of the solder pillars 320 is connected to only one of the conductive connection pillars 210. The material of the solder pillars 320 may be tin, tin-silver alloy, tin-silver-copper alloy or tin-lead alloy.

In one embodiment, the carrier plate 300 is a substrate, such as a PCB board or a BT board. In some other embodiments, the carrier plate may be a lead frame.

Referring to FIG. 5, a method of forming the solder pillars 320 includes forming a mesh plate 310 on a surface of the carrier plate 300, wherein the mesh plate 310 has a plurality of through holes. A distance between centers of adjacent through holes is equal to a distance between the centers of adjacent conductive connection pillars 210. Referring to FIG. 6, the method of forming the solder pillars 320 also includes respectively forming a solder pillar 320 in each of the through holes by a printing process. Referring to FIG. 7, the method of forming the solder pillars 320 further includes removing the mesh plate 310 after the printing process is performed.

The advantages of forming the solder pillars 320 by the printing process include that the plurality of solder pillars 320 formed may have a uniform shape and a uniform size, and the spacing between the solder pillars 320 may be small.

During a subsequent reflow-soldering process, the solder pillars 320 are melted. The height of the solder layers 321 is lower than the height of the solder pillars 320, while the radial dimension of the solder layers 321 may become large. In one embodiment, the radial dimension of the solder pillars 320 is designed to be smaller than the radial dimension of the conductive connection pillars 210. Such configuration may prevent the radial dimension of the solder layers 321 from being excessively large, and reduce the risk of adjacent solder layers 321 being connected together. Moreover, the amount of solder materials may be decreased, and thus the fabrication costs may be reduced.

In one embodiment, the ratio of the radial dimension of the solder pillars 320 to the radial dimension of the conductive connection pillars 210 is in a range of about ⅖ to about ⅗, for example ½.

Figure 8:
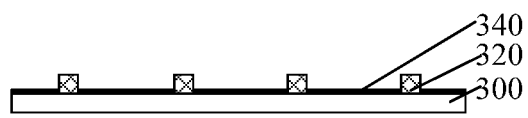
Figure 9:
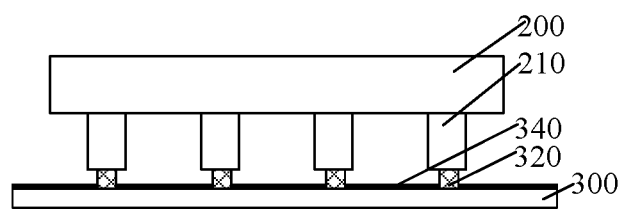

Returning to FIG. 3, a second barrier layer 340 is formed (S203). As shown in FIG. 8, the second barrier layer 340 is located above a surface of the carrier plate 300 around the solder pillars 320.

In one embodiment, after the mesh plate 310 is removed, a second barrier layer 340 is formed on a surface of the carrier plate 300 around the solder pillars 320.

In one embodiment, the material of the second barrier layer 340 is insulation glue, and the second barrier layer 340 is formed after the solder pillars 320 are formed.

In some other embodiments, the material of the second barrier layer is a plastic encapsulation material, and a process of forming the second barrier layer is a plastic encapsulation process. The second barrier layer is formed before the solder pillars are formed.

The second barrier layer 340 may prevent the material of the solder pillars 320 from flowing horizontally along the surface of the carrier plate 300 during a reflow-soldering process. Accordingly, collapse of the solder layers 321 may be prevented, and short circuits between the adjacent solder layers 321 may be avoided.

The thickness of the second barrier layer 340 is less than the height of the solder pillars 320. That is, a flow space for the melted material of the solder pillars 320 is not completely sealed, and heat generated during the melting process of the solder pillars 320 may be timely released into the environment. Accordingly, the surfaces of the solder layers subsequently formed may be smooth, and the quality of the solder layers may thus be improved.

In one embodiment, the thickness of the second barrier layer 340 is in a range of about 10 micrometers to about 30 micrometers, such as 10 micrometers, 15 micrometers, 20 micrometers, or 30 micrometers. If the thickness of the second barrier layer 340 is larger than 30 micrometers, some of the material for the second barrier layers 340 is wasted. Further, as the second barrier layer 340 is too thick, the heat generated during the melting process of the solder pillars 320 may not be effectively dissipated. If the thickness of the second barrier layer 340 is less than 10 microns, the second barrier layer 340 may not effectively block the material of the solder pillars 320 during a subsequent reflow-soldering process.

Returning to FIG. 3, after the first barrier layers 221 and the second barrier layer 340 are formed, the solder pillars 320 are brought into contact with the second surfaces 210b (S204). As FIG. 9, the conductive connection pillars 210 are located above the solder pillars 320, and a center of each conductive connection pillars 210s is aligned with the center of its corresponding solder pillar 320. During the subsequent reflow-soldering process, as the conductive connection pillars 210 are placed above the solder pillars 320, under the action of gravity, the melted material of the solder pillars 320 may not flow to the semiconductor chip 200.

Figure 10:
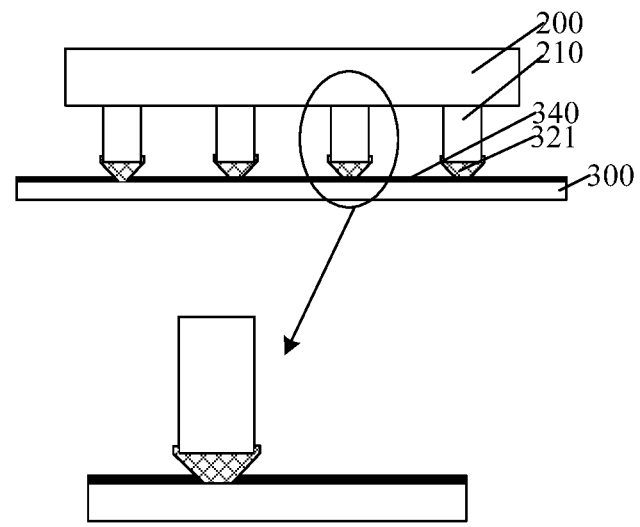

Returning to FIG. 3, after the solder pillars 320 are brought into contact with the second surfaces 210b, a reflow-soldering process is performed (S205). As shown in FIG. 10, after the reflow-soldering process, the solder pillars 320 turn into solder layers 321. The thickness of the second barrier is less than the thickness of the solder layers.

In one embodiment, the height of the solder pillars 320 is in a range of about 20 micrometers to about 100 micrometers, and correspondingly, the height of the solder layers 321 is in a range of about 5 micrometers to about 30 micrometers.

In one embodiment, the width of the solder layers 321 gradually decreases in a direction from the conductive connection pillars 210 to the carrier plate 300 and along the normal direction of the surface of the carrier plate 300.

Figure 11:
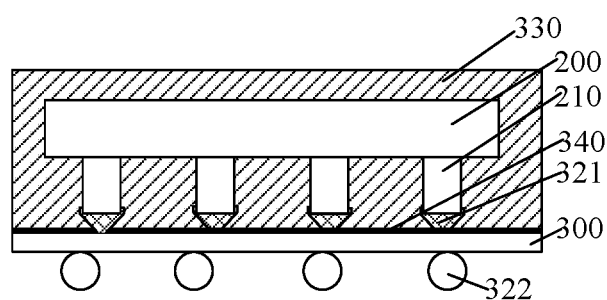

Returning to FIG. 3, after the reflow-soldering process, a plastic encapsulation layer 330 is formed above the carrier plate 300, the semiconductor chip 200, the conductive connection pillars 210, and the solder layers 321 (S206), as shown in FIG. 11.

In one embodiment, the carrier plate 300 is a substrate. Ball implantation is performed on a surface of the carrier plate 300 away from the semiconductor chip 200, forming solder balls 322 on a surface of the carrier plate 300 away from the semiconductor chip 200, as shown in FIG. 11.

Figure 12:
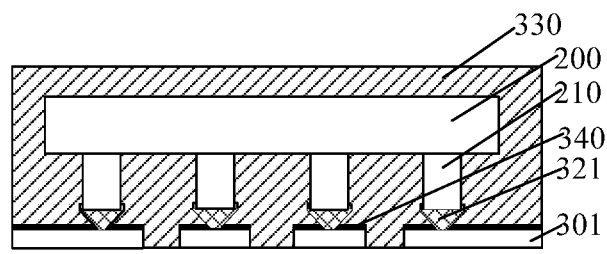

In some other embodiments, referring to FIG. 12, the carrier plate 301 is a lead frame, and ball implantation on a surface of the carrier plate 301 away from the semiconductor chip 200 is not need.

Correspondingly, the present disclosure provides a packaging structure formed by the process illustrated in FIG. 3. Referring to FIG. 10, the packaging structure includes a semiconductor chip 200 and conductive connection pillars 210. Each of the conductive connection pillars 210 has a first surface 210a (referring to FIG. 4) and a second surface 210b (referring to FIG. 4), and the first surface 210a and the second surface 210b are opposite to each other. The first surfaces 210a of the conductive connection pillars 210 are fixed to the surface of the semiconductor chip 200. The packaging structure also includes a carrier plate 300. The carrier plate 300 is disposed opposite to the semiconductor chip 200. The conductive connection pillars 210 are located between the semiconductor chip 200 and the carrier plate 300, and the second surfaces 210b face the carrier plate 300. The packing structure further includes solder layers 321 between a surface of the carrier plate 300 and the second surfaces 210b, and a second barrier layer 340 located on the surface of the carrier 300 around the solder layers 321.

The material of the second barrier layer 340 is either insulation glue or plastic encapsulation material. The second barrier layer 340 may limit the positions where the solder layers 321 are in contact with the surface of the carrier plate 300. Thus, spaces where the material of the solder layers 321 may extend along the surface of the carrier plate 300 are small. Accordingly, contact areas of the solder layers 321 with the surface of the carrier plate 300 may be small, and collapse of the solder layers 321 may be avoided.

The thickness of the second barrier layer 340 is less than the height of the solder pillars 320. That is, a flow space for the melted material of the solder pillars 320 is not completely sealed, and heat generated during the melting process of the solder pillars 320 may be timely released into the environment. Accordingly, the surfaces of the solder layers subsequently formed may be smooth, and the quality of the solder layers may thus be improved. Further, the electrical connection performance between the solder layers 321 and the carrier plate 300 may be improved, and the electrical connection performance between the solder layers 321 and the second surfaces 210b may be improved.

In one embodiment, the thickness of the second barrier layer 340 is in a range of about 10 micrometers to about 30 micrometers, such as 10 micrometers, 15 micrometers, 20 micrometers, or 30 micrometers. If the thickness of the second barrier layer 340 is larger than 30 micrometers, some of the material for the second barrier layers 340 is wasted. Further, as the second barrier layer 340 is too thick, the heat generated during the melting process of the solder pillars 320 may not be effectively dissipated. If the thickness of the second barrier layer 340 is less than 10 microns, the second barrier layer 340 may not effectively restrict the positions where the solder layers 321 are in contact with the surface of the carrier plate 300.

In one embodiment, the width of the solder layers 321 gradually decreases in a direction from the conductive connection pillars 210 to the carrier plate 300 and along the normal direction of the surface of the carrier plate 300. The height of the solder layers 321 is in a range of about 5 micrometers to about 30 micrometers.

In one embodiment, there are a plurality of conductive connecting pillars 210 and a plurality of solder layers 321. There is one solder layer 321 between one conductive connection pillar 210 and the surface of the carrier plate 300. In some other embodiments, there may be one conductive connection pillar 210 and one solder layer 321.

In one embodiment, a center of each of the conductive connection pillars 210 is aligned with a center of a corresponding solder layer 321. That is, the projection of the center of the conductive connection pillar 210 on the surface of the carrier plate 300 overlaps with the projection of the center of the solder layer 321 on the surface of the carrier plate 300.

In one embodiment, the carrier plate 300 is a substrate, such as a PCB board or a BT board. In some other embodiments, referring to FIG. 12, the carrier plate may be a lead frame.

When the carrier plate 300 is a substrate, the packaging structure further includes solder balls 322 (referring to FIG. 11). The solder balls are located on a surface of the carrier plate 300 facing away from the semiconductor chip 200.

The packaging structure further includes a plastic encapsulation layer 330 (referring to FIG. 11 and FIG. 12). The plastic encapsulation layer 330 is located on a surface of the carrier plate, and the plastic encapsulation layer 330 covers the semiconductor chip 200, the conductive connection pillars 210, and the solder layers 421 and the second barrier layer 340.

Figure 13:
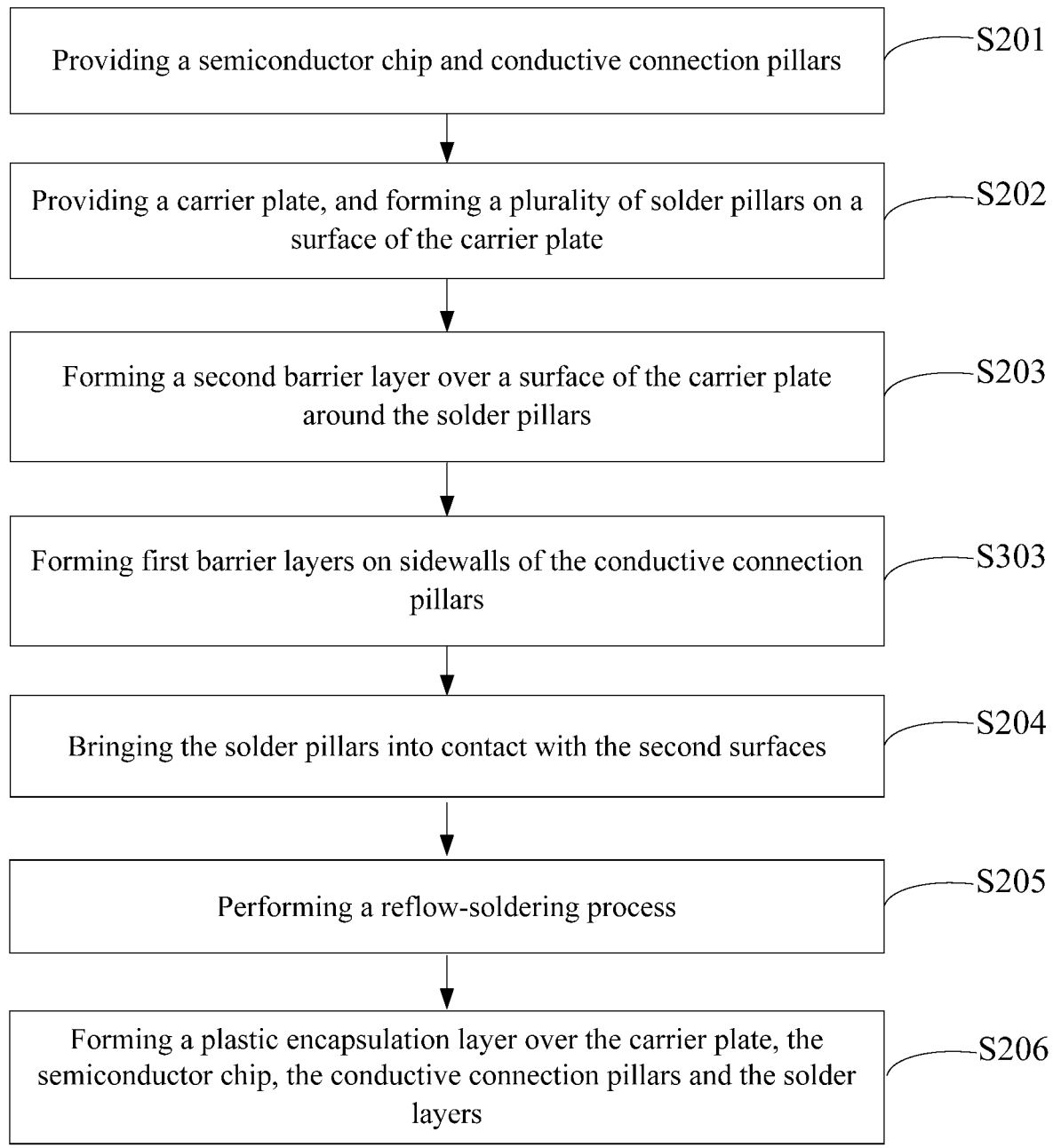
FIG. 13 illustrates another exemplary process of forming a packaging structure consistent with the disclosed embodiments.

FIG. 13 illustrates another exemplary process of forming a packaging structure. FIGS. 14 to 19 illustrate structures corresponding to certain stages of the process. As shown in FIG. 13, before bringing the solder pillars into contact with the second surfaces, the process further includes forming first barrier layers on sidewalls of the conductive connection pillars (S303). The first barrier layers expose the second surfaces of the conductive connection pillars.

Figure 14:
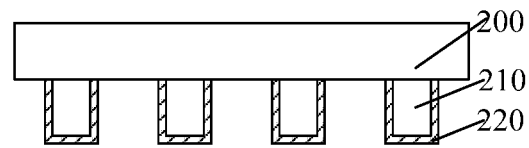
FIGS. 14 to 19 illustrate structures corresponding to certain stages of another exemplary process of forming a packaging structure consistent with the disclosed embodiments.

FIG. 14 is a schematic view based on FIG. 4. Referring to FIG. 14, barrier material layers 220 are formed on the second surfaces 210b and the sidewalls of the conductive connection pillars 210. In one embodiment, the material of the barrier material layers 220 is insulation glue, and the process of forming the barrier material layers 220 is a brushing process. Since the barrier material layers 220 are formed on both the second surfaces 210b and the sidewalls of the conductive connection pillars 210, the brushing process does not require strict control on the position of the brushing. Hence, the difficulty in forming the barrier material layers 220 may be decreased.

In some other embodiments, the material of the barrier material layers 220 may be metal oxide, and the process of forming the barrier material layers 220 may be an oxidation process, including dry oxidation or wet oxidation. For example, when the conductive connection pillars 210 are copper pillars, the material of the barrier material layers 220 may be copper oxide.

Figure 15:
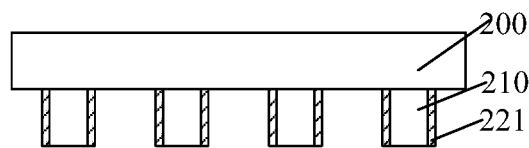

As shown in FIG. 15, the barrier material layers 220 on the second surfaces 210b are removed, and first barrier layers 221 are thus formed on the sidewalls of the conductive connection pillars 210. The barrier material layers 220 on the second faces 210b may be removed by a sanding process.

The function of the first barrier layers 221 includes preventing the material of the solder pillars from flowing upward along the sidewalls of the conductive connection pillars 210 during a subsequent reflow-soldering process.

In one embodiment, the material of the first barrier layers 221 is insulation glue, and the material type of the first barrier layers 221 is different from the material type of subsequent solder pillars. The first barrier layers 221 may thus prevent the material of the solder pillars from flowing upward along the sidewalls of the conductive connection pillars during a subsequent reflow-soldering process, and thus avoid the quality degradation of the solder layers. Moreover, since the material type of the first barrier layers 221 and the material type of the subsequent solder pillars are different, the material of the solder pillars may not flow upward along the sidewalls of the first barrier layers 221.

In some other embodiments, the material of the first barrier layers may be metal oxide.

In one embodiment, the first barrier layers 221 have a thickness in a range of about 10 micrometers to about 30 micrometers, such as 10 micrometers, 15 micrometers, 20 micrometers, or 30 micrometers. If the thickness of the first barrier layers 221 is larger than 30 micrometers, some of the material of the first barrier layers may be wasted. Moreover, if the thickness of the first barrier layers 221 is too large, the space subsequently formed between adjacent conductive connection pillars 210 may be too small, and it is thus difficult to fill the space between adjacent conductive connection pillars 210 with a plastic encapsulation layer. If the thickness of the first barrier layers 221 is less than 10 micrometers, the ability of the first barrier layers 221 in preventing the material of the solder pillars from flowing upward along the side walls of the conductive connection pillars 210 may be decreased.

In some other embodiments, the first barrier layers may be directly formed on the sidewalls of the conductive connection pillars by using a brushing process. As such, the position of the brushing should be strictly controlled so that the material of the first barrier layers is not brushed on the second surfaces of the conductive connection pillars.

Figure 16:
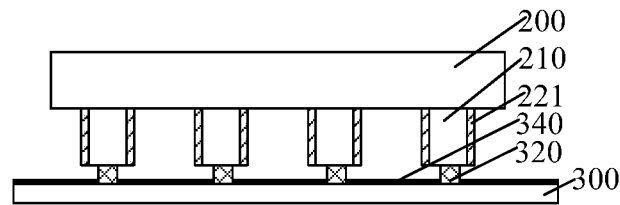

Returning to FIG. 13, after the first barrier layers 221 and the second barrier layer 340 are formed, the solder pillars 320 are brought into contact with the second surfaces 210b (S204). As shown in FIG. 16, the conductive connection pillars 210 are located above the solder pillars 320, and a center of each conductive connection pillars 210s is aligned with the center of its corresponding solder pillar 320. During a subsequent reflow-soldering process, as the conductive connection pillars 210 are placed above the solder pillars 320, under the action of gravity, the melted material of the solder pillars 320 may not flow to the semiconductor chip 200.

Figure 17:
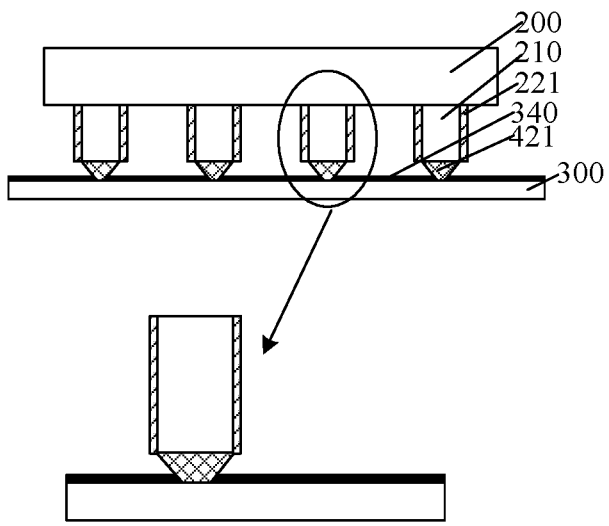

Returning to FIG. 13, after the solder pillars 320 are brought into contact with the second surfaces 210b, a reflow-soldering process is performed (S205). As shown in FIG. 17, after the reflow-soldering process, the solder pillars 320 turn into solder layers 321.

In one embodiment, the height of the solder pillars 320 is in a range of about 20 micrometers to about 100 micrometers, and correspondingly, the height of the solder layers 321 is in a range of about 5 micrometers to about 30 micrometers.

In one embodiment, the width of the solder layers 421 gradually decreases in a direction from the conductive connection pillars 210 to the carrier plate 300 and along the normal direction of the surface of the carrier plate 300.

In one embodiment, each of the solder layers 421 includes a solder top surface in contact with the second surface. The radial dimension of the solder top surface is less than or equal to the total radial dimension of the first barrier layer 221 and the conductive connection pillar 210. The total radial dimension of the first barrier layer 221 and the conductive connection pillar 210 is equal to the sum of the radial dimension of the conductive connection pillar 210 and twice of the thickness of the first barrier layer 221.

Figure 18:
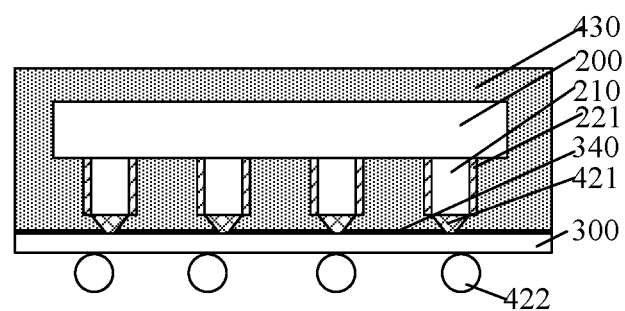

Returning to FIG. 13, after the reflow-soldering process, a plastic encapsulation layer 430 is formed above the carrier plate 300, the semiconductor chip 200, the conductive connection pillars 210, and the solder layers 321 (S206). As shown in FIG. 18, the plastic encapsulation layer 430 covers the first barrier layers 221 and the second barrier layer 340.

In one embodiment, the carrier plate 300 is a substrate. Ball implantation is performed on a surface of the carrier plate 300 away from the semiconductor chip 200, forming solder balls 322 on a surface of the carrier plate 300 away from the semiconductor chip 200, as shown in FIG. 18.

Figure 19:
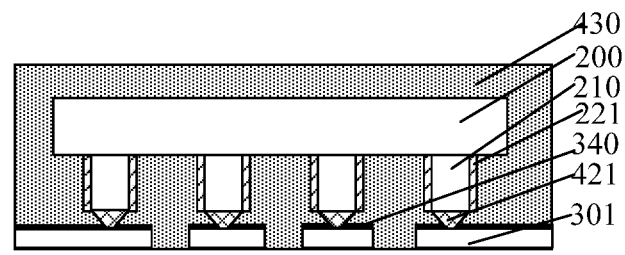

In some other embodiments, referring to FIG. 19, the carrier plate 301 is a lead frame, and ball implantation on a surface of the carrier plate 301 away from the semiconductor chip 200 is not need.

Correspondingly, the present disclosure also provides a packaging structure formed by the process illustrated by FIG. 13. Referring to FIG. 17, the packaging structure includes a semiconductor chip 200 and conductive connection pillars 210. Each of the conductive connection pillars has a first surface 210a (referring to FIG. 4) and a second surface 210b (referring to FIG. 4) that are opposite to each other. The first surfaces 210a of the conductive connection pillars 210 are fixed to the surface of the semiconductor chip 200. The packaging structure also includes a carrier plate 300, and the carrier plate 300 is disposed opposite to the semiconductor chip 200. The packaging structure also includes conductive connection pillars 210 located between the semiconductor chip 200 and the carrier plate 300, and the second surfaces 210b faces the carrier plate 300. The packaging structure also includes first barrier layers on the sidewalls of the conductive connection pillars 210, wherein the first barrier layers do not cover the second surfaces. The packaging structure further includes solder layers 421 and a second barrier layer 340. The solder layers 421 are located between the surface of the carrier plate and the second surfaces, and the second barrier layer 340 is located on the surface of the carrier plate 300 around the solder layers 421.

In one embodiment, the first surfaces 210a and the second surfaces 210b are parallel to the surface of the semiconductor chip 200, and sidewalls of the conductive connection pillars 210 are perpendicular to the surface of the semiconductor chip 200.

The material of the conductive connecting pillars 210 may be metal, for example, copper. The conductive connection pillars 210 may electrically connect the semiconductor chip 200 and the carrier plate 300.

The first barrier layers 221 may protect the sidewalls of the conductive connection pillars 210, and the first barrier layers 221 may prevent the material of the solder layers 421 from adhering to the sidewalls of the conductive connection pillars 210.

In one embodiment, the material of the first barrier layers 221 is insulation glue, and the material type of the first barrier layers 221 is different from the material type of the solder layers 421. The first barrier layers 221 may thus prevent the material of the solder layers 421 from adhering to the sidewalls of the conductive connection pillars 210, and thus avoid the quality degradation of the solder layers. Moreover, since the material type of the first barrier layers 221 and the material type of the solder layers 421 are different, the material of the solder layers may not adhere to the sidewalls of the first barrier layers 221.

In some other embodiments, the material of the first barrier layers may be metal oxide. For example, when the material of the conductive connection pillars 210 is copper, the material of the first barrier layers 221 may be copper oxide.

In one embodiment, the first barrier layers 221 have a thickness in a range of 10 micrometers to 30 micrometers, such as 10 micrometers, 15 micrometers, 20 micrometers, or 30 micrometers. If the thickness of the first barrier layers 221 is larger than 30 micrometers, some of the material of the first barrier layers may be wasted. Moreover, if the thickness of the first barrier layers 221 is too large, the space subsequently formed between adjacent conductive connection pillars 210 may be too small, and it is thus difficult to fill the space between adjacent conductive connection pillars 210 with a plastic encapsulation layer. If the thickness of the first barrier layers 221 is less than 10 micrometers, the ability of the first barrier layers 221 in protecting the conductive connection pillars 210 may be decreased.

In one embodiment, there are a plurality of conductive connection pillars 210 and a plurality of solder layers 421. There is one solder layer 321 between the surface of the carrier plate 300 and each of the conductive connection pillars 210. In some other embodiments, there may be one conductive connection pillar 210 and one solder layer 321.

In one embodiment, the height of the solder layers 421 is in a range of about 5 micrometers to about 30 micrometers.

In one embodiment, each of the solder layers 321 includes a solder top surface that is in contact with a second surface. The radial dimension of the solder top surface is less than or equal to the total radial dimension of the first barrier layer 221 and the conductive connection pillar 210. The total radial dimension of the first barrier layer 221 and the conductive connection pillar 210 is equal to the sum of the radial dimension of the conductive connection pillar 210 and twice of the thickness of the first barrier layer 221.

In one embodiment, the width of the solder layers 421 gradually decreases in a direction from the conductive connection pillars 210 to the carrier plate 300 and along the normal direction of the surface of the carrier plate 300. The material of the solder layers 421 may be tin, tin-silver alloy, tin-silver-copper alloy, or tin-lead alloy.

In one embodiment, the carrier plate 300 is a substrate, such as a PCB board or a BT board. In some other embodiments, the carrier plate may be a lead frame.

When the carrier plate 300 is a substrate, the packaging structure further includes solder balls 322 (referring to FIG. 18), and the solder balls are located above a surface of the carrier 300 facing away from the semiconductor chip 200.

The packaging structure further includes a plastic encapsulation layer 430 (referring to FIG. 18 and FIG. 19). The plastic encapsulation layer 430 is located above the surface of the carrier plate, and the plastic encapsulation layer 430 covers the semiconductor chip 200, the conductive connection pillars 210, the solder layers 421, the first barrier layers 221 and the second barrier layer 340.

As disclosed, the technical solutions of the present disclosure have the following advantages.

A packaging structure provided by the present disclosure includes a second barrier layer for limiting spaces where solder layers are in contact with a surface of a carrier plate. Thereby, dimensions of the solder layer material extending along the surface of the carrier plate are small, and accordingly, contact areas between the solder layers and the surface of the carrier plate are small. Thereby, collapse of the solder layers may be prevented, and the performances of the packaging structure may be improved.

Further, the packaging structure includes a plurality of conductive connection pillars and a plurality of solder layers. There is one solder layer between each of the conductive connection pillars and the surface of the carrier plate. Since the collapse of the solder layers may be prevented, short circuits between adjacent solder layers may be avoided.

Further, the packaging structure includes first barrier layers on sidewalls of the conductive connection pillars, and the first barrier layers expose second surfaces of the conductive connection pillars. The first barrier layers may protect the conductive connection pillars, and contacts between the solder layer material and the sidewalls of the conductive connection pillars may be avoided. Since positions of the solder layers may be limited by the first barrier layers, voids in the solder layers may be prevented, and the quality of the solder layers may thus be improved.

The embodiments disclosed herein are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit and scope of the invention, such other modifications, equivalents, or improvements to the disclosed embodiments are intended to be encompassed within the scope of the present disclosure.

What is claimed is:

1. A packaging structure, comprising:
   a semiconductor chip;
   conductive connection pillars, wherein each of the conductive connection pillars has a first surface and a second surface opposite to the first surface, and first surfaces of the conductive connection pillars are fixed to a surface of the semiconductor chip;
   a carrier plate, wherein the carrier plate is disposed opposite to the semiconductor chip, the conductive connection pillars are located between the semiconductor chip and the carrier plate, and second surfaces of the conductive connection pillars face the carrier plate;
   solder layers located between the carrier plate and the second surfaces, wherein a width of the solder layers decreases linearly along a normal direction of the surface of the carrier plate from the second surface of the conductive connection pillars to a top surface of the carrier plate;
   first barrier layers on sidewalls of the conductive connection pillars, wherein the first barrier layers are insulation glue and formed by a brushing process, and the first barrier layers do not cover the second surfaces of the conductive connection pillars, and each of the solder layers cover the second surface of a corresponding conductive connection pillar and a portion of a bottom surface of a corresponding first barrier layer, and exposes a remaining portion of the bottom surface of the corresponding first barrier layer;

a planar barrier layer including a plurality of sections isolated from each other located on a surface of the carrier plate with an opening in each of the plurality of sections, each of the solder layers filling up the opening in a corresponding section, wherein the planar barrier layer covers a lower portion of sidewalls of the solder layers, and the planar barrier layer has a thickness less than a height of the solder layers; and solder balls that is located on the surface of the carrier plate facing away from the semiconductor chip when the carrier plate is a substrate.

2. The packaging structure according to claim 1, wherein:
the first surfaces and the second surfaces of the conductive connection pillars are parallel to a surface of the semiconductor chip; and
sidewalls of the conductive connection pillars are perpendicular to the surface of the semiconductor chip.

3. The packaging structure according to claim 1, wherein a material of the planar barrier layer includes an insulation glue or a plastic encapsulation material.

4. The packaging structure according to claim 1, wherein a thickness of the planar barrier layer is in a range of about 10 micrometers to about 30 micrometers.

5. The packaging structure according to claim 1, wherein the thickness of the first barrier layers is in a range of about 10 micrometers to about 30 micrometers.

6. The packaging structure according to claim 1, further comprising a plastic encapsulation layer, wherein:
the plastic encapsulation layer is located over the surface of the carrier plate; and
the plastic encapsulation layer covers the semiconductor chip, the conductive connection pillars, the solder layers, the first barrier layers, and the planar barrier layer, wherein the semiconductor chip, the conductive connection pillars, the solder layers, the first barrier layers, and the planar barrier layer are completely embedded in the plastic encapsulation layer.

7. The packaging structure according to claim 1, wherein:
one of the solder layers includes a solder top surface that is in contact with one of the second surfaces; and
the radial dimension of the solder top surface is less than or equal to the total radial dimension of the first barrier layer and the conductive connection pillar.

8. The packaging structure according to claim 1, wherein the packaging structure includes a plurality of conductive connection pillars and a plurality of solder layers; and
there is one solder layer between one of the conductive connection pillars and the carrier plate.

9. The packaging structure according to claim 1, wherein a center of one of the conductive connection pillars is aligned with a center of one of the solder layers.

10. The packaging structure according to claim 1, wherein a material of the solder layers includes tin, tin-silver alloy, tin-silver-copper alloy, or tin-lead alloy.

11. The packaging structure according to claim 1, wherein a height of the solder layers is in a range of about 5 micrometers to about 30 micrometers.

12. The packaging structure according to claim 1, further comprising a mesh plate on the surface of the carrier plate in a printing process, wherein the mesh plate includes a plurality of through holes.

13. The packaging structure according to claim 12, wherein the solder layers is formed from solder pillars in a reflow-soldering process, and wherein a solder pillar is formed from a through hole of the mesh plate by the printing process and the mesh plate is removed after the printing process is performed.

14. The packaging structure according to claim 1, wherein the first barrier layers on sidewalls of the conductive connection pillars prevent a material of the solder layers from flowing upward along the sidewalls of the conductive connection pillars.

15. The packaging structure according to claim 1, wherein:
the planar barrier layer completely covers the surface of the carrier plate exposed by the solder layers, and
the solder layers are covering a bottom portion of sidewalls of the conductive connection pillars.

* * * * *